United States Patent
Hu et al.

(10) Patent No.: US 10,626,250 B2
(45) Date of Patent: Apr. 21, 2020

(54) RESIN COMPOSITION

(71) Applicant: Elite Electronic Material(Zhongshan) Co., Ltd., Zhongshan, Guangdong Province (CN)

(72) Inventors: Zhi-Long Hu, Zhongshan (CN); Chen-Yu Hsieh, Taoyuan (TW)

(73) Assignee: Elite Electronic Material(Zhongshan) Co., Ltd., Zhongshan, Guangdong Province (CN)

( * ) Notice: Subject to any disclaimer, the term of this patent is extended or adjusted under 35 U.S.C. 154(b) by 287 days.

(21) Appl. No.: 15/225,839

(22) Filed: Aug. 2, 2016

(65) Prior Publication Data

US 2017/0166729 A1    Jun. 15, 2017

(30) Foreign Application Priority Data

Dec. 9, 2015    (CN) .......................... 2015 1 0903678

(51) Int. Cl.
  *C08K 5/5313*    (2006.01)
  *C08J 5/24*    (2006.01)
  *H05K 1/03*    (2006.01)
  *H05K 1/09*    (2006.01)
  *C09D 5/18*    (2006.01)
  *C09D 171/12*    (2006.01)
  (Continued)

(52) U.S. Cl.
  CPC .............. *C08K 5/5313* (2013.01); *C08J 5/24* (2013.01); *C08K 3/36* (2013.01); *C08K 5/14* (2013.01); *C08L 71/126* (2013.01); *C09D 5/18* (2013.01); *C09D 7/61* (2018.01); *C09D 171/12* (2013.01); *H05K 1/0373* (2013.01); *C08J 2371/12* (2013.01); *C08L 2201/02* (2013.01); *C08L 2203/206* (2013.01); *C08L 2205/03* (2013.01); *C08L 2205/035* (2013.01); *H05K 1/0326* (2013.01); *H05K 2201/012* (2013.01)

(58) Field of Classification Search
  CPC .. C09D 5/18; C09D 171/12; C08J 5/24; C08J 2371/12; C08J 2425/10; C08J 2447/00; C08K 5/5313; C08L 71/126; C08L 2201/02; C08L 2205/035; C08L 2205/03; C08L 2203/206; H05K 1/09; H05K 1/0326; H05K 2201/012
  See application file for complete search history.

(56) References Cited

U.S. PATENT DOCUMENTS

2008/0033117 A1* 2/2008 Ishii ...................... C08F 283/08
                                                      525/391
2012/0055705 A1* 3/2012 White ............... C07F 9/657172
                                                      174/259

(Continued)

*Primary Examiner* — Bijan Ahvazi
(74) *Attorney, Agent, or Firm* — Winston Hsu

(57) ABSTRACT

The present invention relates to resin composite materials, and more particularly, to low-dielectric resin composition and prepreg, resin film, resin coated copper, laminate and printed circuit board formed therefrom. The low-dielectric resin composition includes a phosphorus-containing flame retardant as shown in formula (I) and a resin with an active unsaturated bond. The low-dielectric resin composition may further be manufactured as a prepreg, a resin film, a resin coated copper, a laminate, or a printed circuit board, having a high glass transition temperature, low dielectric property, halogen-free flame retardancy and low percent of thermal expansion of laminate.

23 Claims, 2 Drawing Sheets

(51) Int. Cl.
     *C08L 71/12*     (2006.01)
     *C08K 3/36*      (2006.01)
     *C08K 5/14*      (2006.01)
     *C09D 7/61*      (2018.01)

(56) References Cited

U.S. PATENT DOCUMENTS

2014/0044918 A1*   2/2014   Zeng ........................ C08L 47/00
                                                                               428/141
2014/0349090 A1*  11/2014   Hsieh ...................... C08L 71/12
                                                                               428/209

\* cited by examiner

RESIN COMPOSITION

BACKGROUND OF THE INVENTION

1. Field of the Invention

The present invention relates to a resin composite material, and more particularly, to a low-dielectric resin composition and a prepreg, a resin film, a resin coated copper, a laminate and a printed circuit board made from the low-dielectric resin composition.

2. Description of the Prior Art

Low-dielectric resin materials have become the mainstream for the development of laminates with high transmission speed, wherein low dissipation factor and low dielectric constant are one of the main evaluation indicators of the low-dielectric resin materials. Besides, other evaluation indicators include glass transition temperature, percent of thermal expansion, and thermal resistance of the laminate and peel strength between the laminate and the copper foil.

One of the common methods of providing flame retardancy for the low-dielectric resin materials of the conventional technology is using the halogen-containing flame retardants, but the drawback of this method is not environmentally friendly.

The peel strength is a basic main property. Regarding the general FR-4 laminate, its long-term performance of peel strength between the resin insulating layer and the copper foil is steady, with few problems, in the past. However, in the technique of the lead-free and halogen-free copper-clad laminate (CCL), the peel strength is more and more important. When high thermal resistance and low percent of thermal expansion are pursued for the lead-free and halogen-free resin composition featuring a high thermal resistance and a low percent of thermal expansion simultaneously, the peel strength of the laminate made from the related resin composition is decreased accordingly. The printed circuit board (PCB) made from the laminate has to be processed by welding, and that is a thermal shock trial process for the printed circuit board. In this process, the problems of track lifting, pad lifting and delamination occur easily because of the low peel strength. Thus, decreasing the percent of thermal expansion and increasing the thermal resistance and peel strength of the halogen-free low-dielectric resin composition simultaneously is still a problem needed to be solved.

SUMMARY OF THE INVENTION

One of the objectives of the present invention is to provide a low-dielectric resin composition having a higher glass transition temperature.

Another of the objectives of the present invention is to provide a low-dielectric resin composition having lower percent of thermal expansion and higher thermal resistance.

Another of the objectives of the present invention is to further provide a low-dielectric resin composition having higher peel strength between the laminate and the copper foil.

Another of the objectives of the present invention is to even further provide any one of manufactured goods mentioned below: a prepreg, a resin film, a resin coated copper (RCC), a laminate and a printed circuit board which are made from the low-dielectric resin composition of the present invention.

The present invention utilizes the techniques mentioned below to achieve the above objectives.

First, the present invention provides a low-dielectric resin composition comprising:

(a) a phosphorus-containing flame retardant, being expressed by formula (I) below, wherein A is a phenylene, a naphthylene or a biphenylene:

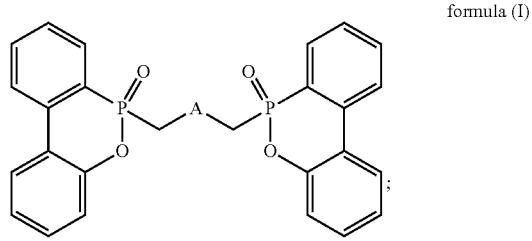

formula (I)

and (b) a resin with an active unsaturated bond, wherein the resin with an active unsaturated bond is a polymer, an oligomer or a monomer which includes one or more reactive functional group(s) of

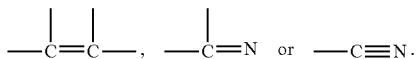

Wherein the phosphorus-containing flame retardant is preferably expressed by formula (Ia) or formula (Ib).

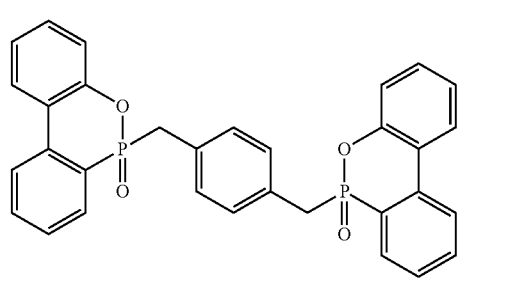

Formula (Ia)

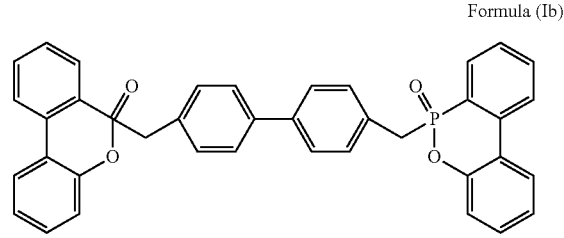

Formula (Ib)

Preferably, the resin with an unsaturated reactive functional group is a vinyl compound resin, and the vinyl compound resin may be vinyl resin. The vinyl compound resin is preferably one or more selected from the following: polyolefin, cyanate ester resin, maleimide, vinyl polyphenylene ether resin, triallyl isocyanurate (TAIC), triallyl cyanurate (TAC) and a combination thereof.

Preferably, the monomer comprising an unsaturated reactive functional group may be any monomer with one or more double bond(s). For example, the monomer comprises a series of styrene monomers, such as styrene, divinylbenzene, trivinylcyclohexane or a combination thereof.

The vinyl compound resin may be a polymer with vinyl group or a prepolymer with vinyl group.

The vinyl compound resin may be vinylbenzyl etherified-dicyclopentadiene-phenol resin manufactured by Chin-Yee Chemical Industries Co., LTD. with the trade name DP-85T.

Preferably, the vinyl compound resin is vinyl polyphenylene ether resin, and the vinyl polyphenylene ether resin is a polyphenylene ether resin with a capping group having an unsaturated double bond.

Preferably, the vinyl polyphenylene ether resin is a polyphenylene ether resin having a structure expressed by one of formula (II) (vinylbenzyl-terminated polyphenylene ether resin) and formula (III) (methylacrylate-terminated polyphenylene ether resin), but not limited thereto:

Formula (II)

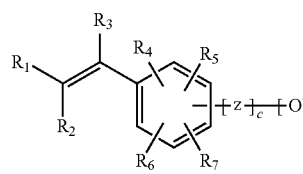 —[Z]$_c$—[OY]$_a$—[oxo]—[YO]$_b$—[Z]$_d$— 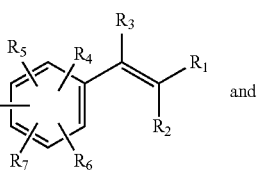 and

Formula (III)

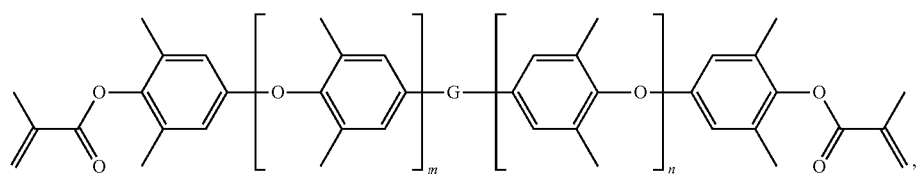

wherein —(O—X—O)— is

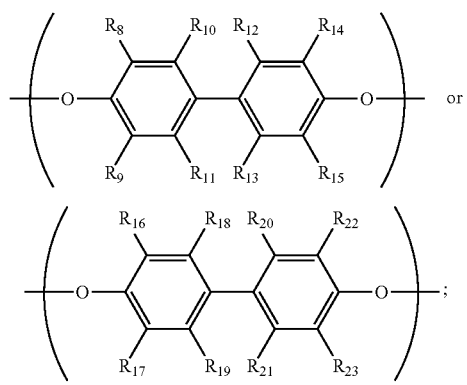 or

—(Y—O)— is

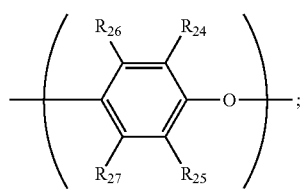;

wherein $R_1$ and $R_2$ are a hydrogen atom respectively, and $R_3$, $R_4$, $R_5$, $R_6$ and $R_7$ are the same as or different from each other, each independently representing a hydrogen atom or an alkyl group;

$R_8$, $R_9$, $R_{10}$, $R_{13}$, $R_{14}$ and $R_{15}$ are the same as or different from each other, each independently representing a C1 to C6 alkyl group or a phenyl group;

$R_{11}$ and $R_{12}$ are the same as or different from each other, each independently representing a hydrogen atom, a C1 to C6 alkyl group or a phenyl group;

$R_{16}$, $R_{17}$, $R_{22}$ and $R_{23}$ are the same as or different from each other, each independently representing a C1 to C6 alkyl group or a phenyl group;

$R_{18}$, $R_{19}$, $R_{20}$ and $R_{21}$ are the same as or different from each other, each independently representing a C1 to C6 alkyl group or a phenyl group;

A is a C1 to C20 linear hydrocarbon, a C1 to C20 branched hydrocarbon or a C1 to C20 cyclic hydrocarbon, preferably a C1 to C6 linear hydrocarbon, a C1 to C6 branched hydrocarbon or a C1 to C6 cyclic hydrocarbon, more preferably —CH$_2$— or —C(CH$_3$)$_2$—;

$R_{24}$ and $R_{25}$ are the same as or different from each other, each independently representing a C1 to C6 alkyl group or a phenyl group, and $R_{26}$ and $R_{27}$ are the same as or different from each other, each independently representing a hydrogen atom, a C1 to C6 alkyl group or a phenyl group;

Z is an organic group having at least one carbon atom, and preferably, Z is a C1 to C6 alkyl group or the organic group further comprises an oxygen atom or a nitrogen atom, wherein Z may be a methylene (—CH$_2$—) for example;

a and b are a natural number ranges from 1 to 30 respectively, and preferably, a and b are, the same as or different from each other, a natural number ranges from 1 to 10 respectively;

c and d are 1 respectively;

G is a —C(CH$_3$)$_2$—, —CH$_2$— or a covalent bond; and m and n are a natural number ranges from 1 to 15 respectively.

Preferably, the vinyl polyphenylene ether resin of the present invention is at least one of the methylacrylate-terminated polyphenylene ether resin and the vinylbenzyl-terminated polyphenylene ether resin. The aforementioned polyphenylene ether resins can denote methacrylate polyphenylene ether resin and vinylbenzyl polyphenylene ether resin.

The vinylbenzyl polyphenylene ether resin represents the polyphenylene ether resin having the structure of

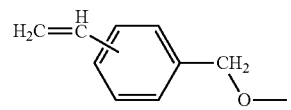

at a terminal of the polyphenylene ether resin.

In a preferred embodiment of the present invention, the methacrylate polyphenylene ether resin is commercially available from Sabic under the trade name SA-9000.

In another preferred embodiment of the present invention, the vinylbenzyl polyphenylene ether resin is commercially available from Mitsubishi Gas Chemical under the trade name OPE-2st.

The polyolefin may be at least one of styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene copolymer, polybutadiene homopolaymer, maleinized styrene-butadiene copolymer, methylstyrene copolymer, petroleum resin and cyclic olefin copolymer or a combination thereof.

The cyanate ester resin may comprise, but not limited to, the cyanate ester resin having the structure of Ar—O—C≡N, wherein Ar may be aromatic functional group, novolac based cyanate ester resin, bisphenol A based cyanate ester resin, bisphenol A novolac cyanate ester resin, bisphenol F based cyanate ester resin, bisphenol F novolac cyanate ester resin, cyanate ester resin having dicyclopentadiene structure, cyanate ester resin having naphthalene ring structure or phenolphthalein based cyanate ester resin.

Examples of the cyanate ester resin are, but not limited to, cyanate ester resins with tradenames Primaset PT-15, PT-30S, PT-60S, CT-90, BADCY, BA-100-10T, BA-200, BA-230S, BA-300S, BTP-2500, BTP-6020S, DT-4000, DT-7000, Methylcy, ME-240S, etc., produced by Lonza.

The maleimide is not particularly limited, and the known available maleimide are all suitable. Preferably, the maleimide is at least one of the following: 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl hexane), N-2,3-Xylylmaleimide, N-2,6-Xylenemaleimide, N-phenylmaleimide and prepolymers of the above-mentioned compounds, such as a prepolymer of diallyl compound and maleimide compound.

The low-dielectric resin composition with the phosphorus-containing flame retardant of the present invention is obtained by mixing the phosphorus-containing flame retardant and the resin with an active unsaturated bond.

The low-dielectric resin composition of the present invention comprises 100 parts by weight of the resin with an active unsaturated bond and 20 to 80 parts by weight of the phosphorus-containing flame retardant. Preferably, if the amount of the resin with an active unsaturated bond is 100 parts by weight, the amount of the phosphorus-containing flame retardant ranges from 20 to 60 parts by weight. More preferably, if the amount of the resin with an active unsaturated bond is 100 parts by weight, the amount of the phosphorus-containing flame retardant ranges from 25 to 60 parts by weight.

Being a selective embodiment, the amount of the components of the resin composition may comprise 100 parts by weight of the vinyl polyphenylene ether resin and 20 to 80 parts by weight of the phosphorus-containing flame retardant. More preferably, the low-dielectric resin composition of the present invention may further comprise other component(s).

For example, the low-dielectric resin composition of the present invention preferably comprises maleimide. For instance, as the vinylbenzyl polyphenylene ether resin occupies 100 parts by weight, the low-dielectric resin composition comprises 5 to 50 parts by weight of the maleimide.

Being a preferred embodiment, the low-dielectric resin composition of the present invention comprises polyolefin. For example, as the amount of the vinylbenzyl polyphenylene ether resin is 100 parts by weight, the low-dielectric resin composition comprises 10 to 70 parts by weight of the polyolefin.

Being a preferred embodiment, the low-dielectric resin composition comprises polyolefin and maleimide at the same time. More preferably, the low-dielectric resin composition comprises the polyolefin with 10 to 70 parts by weight and the maleimide with 5 to 50 parts by weight.

Being a preferred embodiment, the low-dielectric resin composition with phosphorus-containing flame retardant of the present invention preferably comprises the following components: (A) the phosphorus-containing flame retardant; (B) the vinylbenzyl polyphenylene ether resin; (C) the polyolefin; and (D) the maleimide.

More preferably, the low-dielectric resin composition comprises the following amount of the components: 20 to 80 parts by weight of the phosphorus-containing flame retardant, 100 parts by weight of the vinylbenzyl polyphenylene ether resin and 5 to 50 parts by weight of the maleimide. And the low-dielectric resin composition may further selectively comprise 10 to 70 parts by weight of the polyolefin.

More preferably, the low-dielectric resin composition comprises 20 to 80 parts by weight of the phosphorus-containing flame retardant, 100 parts by weight of the vinyl polyphenylene ether resin, 5 to 20 parts by weight of the polyolefin and 10 to 30 parts by weight of the maleimide.

The amount of the phosphorus of the low-dielectric resin composition with the phosphorus-containing flame retardant of the present invention may be modified by adjusting the amount of the phosphorus-containing flame retardant, wherein when the amount of the phosphorus of the low-dielectric resin composition of the present invention reaches 2.2 wt % or more, preferably 2.2 wt % to 3.5 wt %, the low-dielectric resin composition can achieve the effect of flame retardation.

The low-dielectric resin composition with the phosphorus-containing flame retardant of the present invention features a high glass transition temperature, a low dielectric constant, a low dissipation factor and a halogen-free flame retardancy, and the laminate made from the low-dielectric resin composition of the present invention has a low percent of thermal expansion at the same time.

Preferably, the resin composition may further comprise epoxy resin, phenol resin, benzoxazine resin, styrene-maleic anhydride resin, polyester, an amine curing agent, polyamide, polyimide and/or a combination thereof.

The epoxy resin may be one or a combination of the following: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene epoxy resin (DCPD epoxy resin), phosphorus-containing epoxy resin, DOPO epoxy resin, DOPO-HQ epoxy resin, p-xylene epoxy resin, naphthalene epoxy resin, benzofuran epoxy resin, biphenyl novolac epoxy resin, isocyanate modified epoxy resin, phenol benzaldehyde epoxy resin and phenol aralkyl novolac epoxy resin. Wherein the DOPO epoxy resin may be DOPO-containing phenolic novolac epoxy resin (DOPO-PNE), DOPO-containing cresol novolac epoxy resin (DOPO-CNE) and DOPO-containing bisphenol-A novolac epoxy resin (DOPO-BPNE), and DOPO-HQ epoxy resin may be DOPO-HQ containing phenolic novolac epoxy resin (DOPO-HQ-PNE), DOPO-HQ containing cresol novolac epoxy resin (DOPO-HQ-CNE) and DOPO-HQ containing bisphenol-A novolac epoxy resin (DOPO-HQ-BPNE).

The phenol resin suitable for the present invention may be monofunctional phenol resin, difunctional phenol resin or multifunctional phenol resin. The above-described phenol resin is not particularly limited, and the phenol resins used in the industry at present are all within the scope of the phenol resin suitable for the present invention.

Preferably, the phenol resin is one or more selected from the following: hydroxy polyphenylene ether resin, phenoxy resin, phenolic resin and a combination thereof.

The polyester resin suitable for the present invention may be formed through the esterification reaction between an aromatic with dicarboxylic acid group(s) and an aromatic with dihydroxyl group(s), such as the HPC-8000T65 commercially available from Dainippon Ink & Chemicals.

The benzoxazine resin suitable for the present invention may be bisphenol A based benzoxazine resin, bisphenol F based benzoxazine resin, phenolphthalein based benzoxazine resin, dicyclopentadiene benzoxazine resin, oxydianiline type benzoxazine or phosphorus-containing benzoxazine resin, e.g., LZ-8270 (phenolphthalein based benzoxazine resin), LZ-8280 (bisphenol F based benzoxazine resin), or LZ-8290 (bisphenol A based benzoxazine resin) produced by Huntsman or HFB-2006 M produced by Showa Highpolymer Company.

The ratio of styrene (S) and maleic anhydride (MA) of the styrene-maleic anhydride resin suitable for the present invention may be 1:1, 2:1, 3:1, 4:1, 6:1, 8:1 or 12:1, such as the styrene-maleic anhydride copolymer product of SMA-1000, SMA-2000, SMA-3000, EF-30, EF-40, EF-60 and EF-80 commercially available from Cray Valley, but not limited thereto. Further, the styrene-maleic anhydride resin may be esterified styrene-maleic anhydride copolymers, such as the product of esterified styrene-maleic anhydride copolymer of SMA1440, SMA17352, SMA2625, SMA3840 and SMA31890 commercially available from Cray Valley. The aforementioned styrene-maleic anhydride resin may be added to the resin composition of the present invention independently or in a combination form.

The amine curing agent for the present invention may be dicyandiamide, diaminodiphenyl sulfone, diaminodiphenyl methane, diaminodiphenyl ether, diaminodiphenyl sulfide, or a combination thereof.

Preferably, the resin composition may further comprise an additive, and the selected additive may comprise a curing accelerator, a flame retardant, an inorganic filler, a solvent, a toughing agent, a silane coupling agent or a combination thereof.

The curing accelerator suitable for the present invention is utilized for improving the curing rate of the resin composition. Any curing accelerator that accelerates the curing rate of the resin composition of the present invention may be used. The curing accelerator may comprise a Lewis base catalyst or a Lewis acid catalyst. The Lewis base catalyst may comprise at least one of imidazole, a boron trifluoride-amine complex, ethyltriphenylphosphonium chloride, 2-methylimidazole, 2-phenyl imidazole, 2-ethyl-4-methylimidazole, triphenylphosphine and 4-dimethyl amino pyridine. The Lewis acid may comprise metal salt compound. For example, the metal salt compound may be at least one of the salts of manganese, iron, cobalt, nickel, copper and zinc. Preferably, the Lewis acid is a metal catalyst, such as zinc octoate, cobalt octoate, cobalt acetylacetone and zinc acetylacetone. Alternatively, the curing accelerator may also comprise the curing accelerator peroxide capable of generating free radical, comprising, but not limited to, dicumyl peroxide, t-butyl peroxybenzoate, 2,5-dimethyl-2,5-di(t-butylperoxy)-3-hexyne, bis(tert-butylperoxy isopropyl) benzene, or a combination thereof, for instance.

Preferably, if the amount of the resin with an active unsaturated bond is 100 parts by weight, an inorganic filler with 10 to 200 parts by weight may be further added into the resin composition of the present invention in order to improve the thermal conductivity, thermal expansion and mechanical strength of the resin composition, and the added inorganic filler may be uniformly distributed in the resin composition.

The inorganic filler suitable for the present invention comprises silica (with fused state, non-fused state, porous type or hollow type), alumina, aluminum hydroxide, magnesia, magnesium hydroxide, calcium carbonate, aluminum nitride, boron nitride, aluminum silicon carbide, silicon carbide, sodium carbonate, titanium dioxide, zinc oxide, zirconia, quartz, diamond powder, diamond-like powder, graphite, magnesium carbonate, potassium titanate, ceramic fibers, mica, boehmite (AlOOH), zinc molybdate, ammonium molybdate, zinc borate, calcium phosphate, calcination talc, talc, silicon nitride, mullite, calcination kaolin, clay, basic magnesium sulfate whisker, mullite whisker, barium sulfate, magnesium hydroxide whisker, magnesium oxide whisker, calcium oxide whisker, carbon nanotubes, nano-grade silicon dioxide and related inorganic powders or powder particles having an organic core outer shell as an insulator modification. In addition, the inorganic filler may be spherical, fibrous, plate-shaped, granular, sheet-shaped or whisker, and may be optionally pretreated with a silane coupling agent.

The silane coupling agent suitable for the present invention may be at least one of a silane compound and a siloxane compound.

Preferably, the silane coupling agent may be at least one of an amino silane compound, an amino siloxane compound, a styryl silane compound, a styryl siloxane compound, an acrylate silane compound, an acrylate siloxane compound, a methacrylate silane compound, a methacrylate siloxane compound, an alkyl silane compound and an alkyl siloxane compound.

The solvent suitable for the present invention may be at least one of methanol, ethanol, ethylene glycol monomethyl ether, acetone, methyl ethyl ketone (MEK), methyl isobutyl ketone (MIBK), cyclohexanone, methylbenzene (toluene), dimethylbenzene, methoxy ethyl acetate, ethoxy ethyl acetate, propoxy ethyl acetate, ethyl acetate, dimethylformamide, propylene glycol monomethyl ether, γ-butyrolactone (GBL) and diisobutyl ketone (DIBK).

The present invention provides a resin product which is formed by curing the aforementioned resin composition. Specifically, the resin product may be a prepreg, a resin film, a laminate or a printed circuit board.

Specifically, the present invention provides a prepreg having a reinforcing material and a layered material disposed on the reinforcing material, wherein the layered material was made from semi-curing the resin composition (i.e., B-staged). By using the aforementioned resin composition, the prepreg of the present invention features a low percent of thermal expansion, a low dielectric constant, a low dissipation factor, a high thermal resistance, a high flame retardancy, and halogen-free. Wherein, the resin composition is attached to the reinforcing material through impregnation and heated up at a high temperature to become semi-cured, so as to form the prepreg.

The reinforcing material suitable for the present invention comprises fibrous material, woven fabric or non-woven fabric, such as glass fiber fabric, so as to increase the mechanical strength of the prepreg. Preferably, the reinforcing material may be optionally pretreated with a silane coupling agent.

The aforementioned prepreg may be cured to form a fully-cured (i.e., C-staged) prepreg or a cured-state insulating layer through being heated at a high temperature or at a high temperature and a high pressure. If the resin composition comprises solvent, the solvent will evaporate and escape during the high-temperature heating process.

The present invention further provides a resin film which is made from the resin composition that suffers heat baking so as to semi-cure the resin composition. The resin composition may be selectively coated to a polyethylene terephthalate film (PET film) or a polyimide film, followed by heat baking to be semi-cured and form a resin film. Accordingly, the laminate features a low percent of thermal expansion, a low dielectric constant, a low dissipation factor, a high thermal resistance, a flame retardancy, and halogen-free.

The present invention further provides a resin coated copper (RCC). A resin varnish of the low-dielectric resin composition with the phosphorus-containing flame retardant is coated on a copper foil or a PI film cladding on a copper foil before being cured to become semi-cured through being heated at a high temperature, so as to obtain the resin coated copper. The aforementioned resin coated copper made from coating the resin composition on the PI film cladding on the copper foil and curing to become semi-cured through baking is also called a flexible resin coated copper.

The present invention further provides a laminate comprising two metal layers and one insulating layer superimposed between the metal layers. The insulating layer may be formed by curing under high temperature and high pressure through superimposing the aforementioned prepreg or resin film between the metal layers. The material of the metal layers may be copper, aluminum, nickel, platinum, silver, gold or an alloy of any of the above-mentioned material, and preferably, may be a copper foil. The laminates may be, for example, a copper-clad laminate (CCL).

By using the aforementioned resin composition, the laminate has advantages such as low percent of thermal expansion, low dielectric constant, low dissipation factor, good thermal resistance, good flame retardancy and being halogen-free, and is particularly suitable for high speed and high frequency signal transmission printed circuit board. The laminate may be further processed to form printed circuit board whose quality will not be affected when it is jointed with electronic elements and operated at high temperature, high humidity and other harsh environment.

The melting point of the phosphorus-containing flame retardant of the present invention is high. In the measurement analyzed by a differential scanning calorimeter (DSC), the melting point is higher than 270° C.

In an embodiment of the present invention, a compound expressed by formula (I) is selected to be the phosphorus-containing flame retardant.

In a specially preferred embodiment of the present invention, a compound expressed by formula (Ia) is selected (hereinafter denoted as compound A).

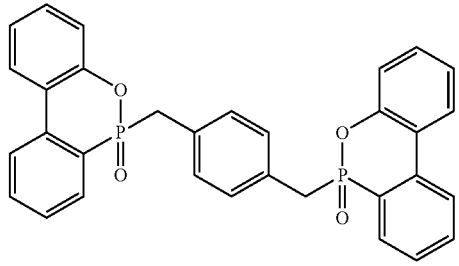

Formula (Ia)

In contrast with the aforementioned compound, a series of phosphorus-containing compounds used in conventional technology are selected according to the present invention, such as formula (IV) and formula (V).

In contrary to the phosphorus-containing compound expressed by formula (IV) (compound B) and the phosphorus-containing compound expressed by formula (V) (compound C), the phosphorus-containing compound A has a smaller specific surface area (specific surface area: formula (V)>formula (IV)>formula (Ia)), a lower oil absorption (oil absorption: formula (V)>formula (IV)>formula (Ia)) and lower varnish viscosity (viscosity: formula (V)>formula (IV)>formula (Ia)). Wherein, if the phosphorus-containing compound has a lower oil absorption, the resin composition will have a lower viscosity, such that when a glass fiber fabric is immersed in the resin composition, the resin composition has a better property of impregnation, so as to advantage the prepreg to have a smooth and flat surface. Because of the lower varnish viscosity of the phosphorus-containing compound A, the treating property of treating process is improved (treating property: formula (Ia)>formula (IV)>formula (V)), such that the appearance of the prepreg is better than the phosphorus-containing compounds expressed by formula (IV) and formula (V).

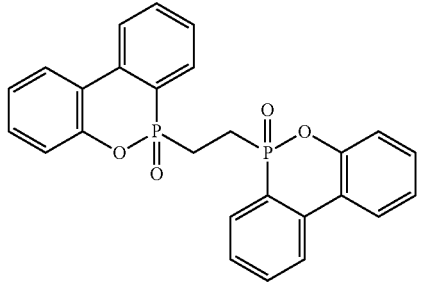

Formula (IV)

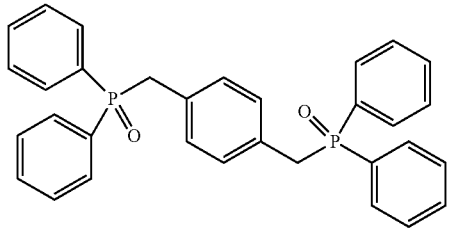

Formula (V)

Compared to conventional technology, the melting point of the phosphorus-containing flame retardant of the present invention is high (higher than 270° C.) and is much higher than the non-reactive phosphorus-containing flame retardant with low melting point used widely in the industry at present, such as phosphazene (SPB-100 of Otsuka Chemical, wherein the melting point is approximately 110° C.) and phosphate compound (PX-200 of Daihachi Chemical, wherein the melting point is approximately 95° C.), and the migration of DOPO at high temperature is small, so that the laminate made from the resin composition has properties of good flame retardancy, low percent of thermal expansion, low dielectric constant and low dissipation factor.

In addition, the phosphorus-containing flame retardant of the present invention has a smaller specific surface area, a lower oil absorption and a lower varnish viscosity. In the fabrication of the prepreg, the phosphorus-containing flame retardant has a good property of impregnation to the glass fiber fabric, such that the treating property can be improved, so as to increase the production rate. Meanwhile, the fabricated prepreg is smooth and flat, without fisheyes, and the appearance of the prepreg is better. Thus, the yield of the product is high.

Compared to conventional technology, the present invention has the following advantages and profitable effects:

(1) In the components of the low-dielectric resin composition of the present invention, the phosphorus-containing flame retardant does not contain a reactive functional group and does not join the reaction, so as a better dielectric property is gained.

(2) The melting point of the phosphorus-containing flame retardant of the present invention is high (higher than 270° C.). Therefore, utilizing the phosphorus-containing flame retardant and the vinyl compound resin at the same time can prepare a prepreg, a resin film, a laminate and a circuit board which feature a lower percent of thermal expansion, a higher thermal resistance, a higher glass transition temperature, a lower dielectric constant and a lower dissipation factor.

(3) In the condition of using a halogen-free flame retardant, the low-dielectric resin composition of the present invention can achieve the effect of flame retardancy in ranking V-0 according to UL94 test method.

These and other objectives of the present invention will no doubt become obvious to those of ordinary skill in the art after reading the following detailed description of the preferred embodiment that is illustrated in the various figures and drawings.

DETAILED DESCRIPTION

The following applications are the further explanations of the present invention. However, the applications of the present invention are not limited by the embodiments listed below. All various modifications or adjustment accorded with the principles or the spirits of the present invention are regarded as the concepts of the present invention.

In the condition without particularly interpretation, the materials and experimental methods of the present invention are the regular materials and methods.

The chemicals for use in the embodiments are as follows:
SPB-100: phosphazene, available from Otsuka Chemical.
PX-200: resorcinol bis[di(2,6-dimethylphenyl)phosphate], available from Daihachi Chemical.
XZ92741: DOPO-bisphenol A novolac resin, available from Dow chemical.

OPE-2st: Vinylbenzyl-terminated polyphenylene ether resin, available from Mitsubishi Gas Chemical.
SA-9000: Methacrylate-terminated polyphenylene ether resin, available from Sabic.
MIR-3000-70MT: biphenyl maleimide, available from Nippon Kayaku.
25B: 2,5-dimethyl-2,5-di(tert-butylperoxy)-3-hexyne, available from Nippon Oils & Fats.
SC-2050 SV: spherical silicon dioxide, available from Admatech.
H-1051: hydrogenated styrene butadiene copolymer, available from Asahi Kasei.
Ricon100: butadiene-styrene copolymer, available from Cray valley.
Ricon184MA6: styrene-butadiene-maleic anhydride copolymer, available from Cray valley.
DVB: divinylbenzene, available from Sigma Aldrich.
TAC: triallyl cyanurate, available from Sigma Aldrich.
Compound A: phosphorus-containing flame retardant with high melting point.

Embodiment 1: A Method of Making Compound A 2 moles (approximately 432 g) of DOPO (9,10-Dihydro-9-Oxa-10-Phosphaphenantrene-10-Oxide), 1 mole (approximately 128 g) of 1,4-bis(chloromethyl)benzene and 2400 g of dichlorobenzene solvent are placed in a blender and are heated to 150° C. and stirred for dissolving the solids, so as to form a evenly mixed solution, and the solution is continuously heated and stirred for 24 hours.

Then, cool the solution to room temperature before washing with hexane and filtering the solution, so as to obtain a white crystal product. Bake the white crystal product for 6 hours under 120° C. to obtain a white powder product, and grind the white powder product to particles whose particle size D50 is 6 μm (representing an amount of the particles whose particle sizes smaller than 6 μm is 50 volume % of the total amount of the particles), so as to obtain compound A.

Figure 1:
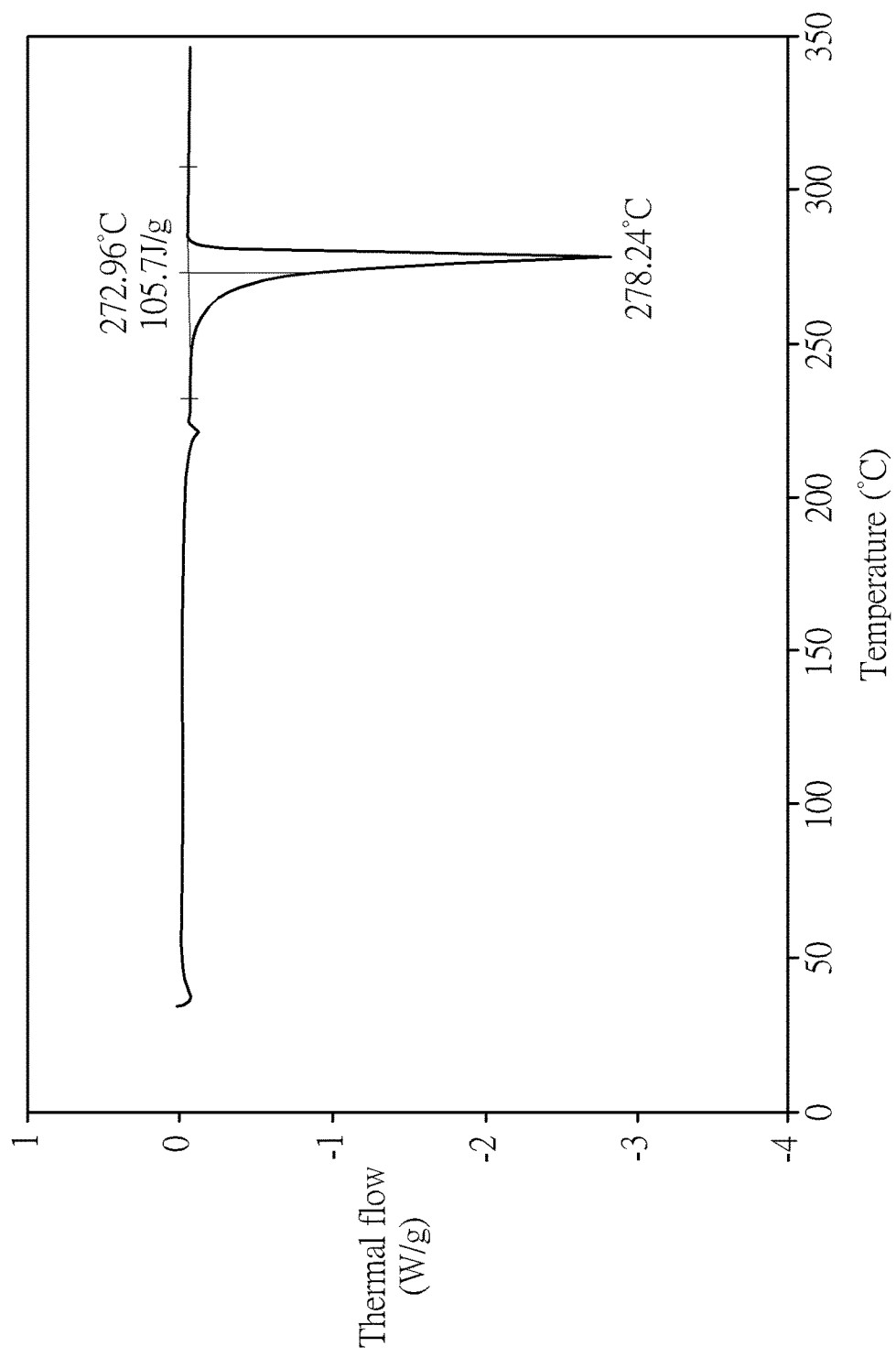
FIG. 1 shows a DSC analysis diagram of the melting point of the compound A.
Figure 2:
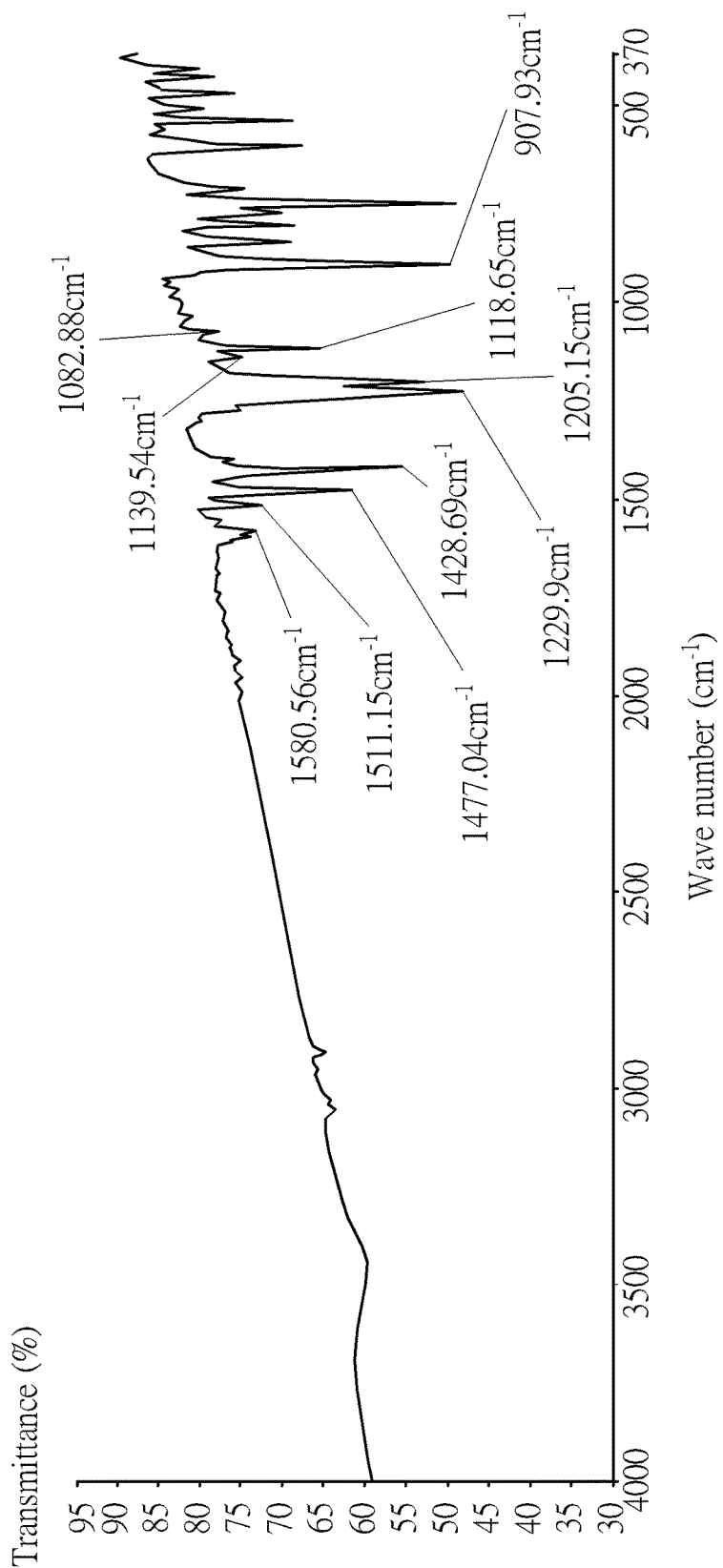
FIG. 2 shows a FTIR spectrum of the compound A.

The compound A is analyzed by the reflection-type fourier transform infrared spectroscopy (reflection-type FTIR), and the result is shown in FIG. 2. The FTIR spectrum reveals absorption peaks indicative of a P-Ph at 1594 $cm^{-1}$, a P=O at 1205 $cm^{-1}$ and a P—O-Ph at 908 $cm^{-1}$.

According to the analysis result of the FTIR, the obtained product has a phosphorus-containing flame retardant expressed by formula (Ia).

The melting point of the compound A measured by DSC is approximately 278° C. Thus, the compound A is the flame retardant with high melting point.

Embodiment 2: Various Low-Dielectric Resins Composition

The main components of the low-dielectric resin composition are the phosphorus-containing flame retardant and resin components.

Various kinds of the low-dielectric resin compositions are shown in Tables 1, 3, 5.

According to the low-dielectric resin compositions shown in the tables, mix each components evenly, so as to obtain a resin varnish of the resin composition, wherein E1 to E12 represent the examples of low-dielectric resin compositions with the phosphorus-containing flame retardant of the present invention, and C1 to C16 represent the comparative examples.

Embodiment 3: Preparation of Resin Film

Coat the resin varnish of each of the resin compositions prepared according to the aforementioned E1 to E12 and C1 to C16 on a PET film (or a PI film) respectively, make the resin composition (approximately 30 μm of thickness) adhere to the film evenly, and undergo a heat baking process to become semi-cured, so as to obtain a resin film, wherein the condition of the heat baking process includes the baking time of 4 minutes under 160° C.

Embodiment 4: Preparation of Resin Coated Copper

Coat the resin varnish of each of the resin compositions prepared according to the aforementioned E1 to E12 and C1 to C16 on a copper foil respectively, make the resin composition (approximately 30 μm of thickness) adhere to the foil evenly, and undergo a heat baking process to become semi-cured, so as to obtain a resin coated copper, wherein the condition of the heat baking process includes the baking time of 4 minutes under 160° C.

Embodiment 5: Preparation of Composite Material with Low Dielectric Constant

Coat the resin varnish of each of the resin compositions prepared according to the aforementioned E1 to E12 and C1 to C16 on a PI film of the resin side of the resin coated copper respectively to obtain the structure of the copper foil, the PI film and the resin composition layer by layer, make the resin composition (approximately 30 μm of thickness) adhere to the film evenly, and undergo a heat baking process to become semi-cured, so as to obtain a flexible resin coated copper, wherein the condition of the heat baking process includes the baking time of 4 minutes under 160° C., and the PI film may be at least one of TPI (thermoplastic polyimide) and PI (polyimide).

Embodiment 6: Preparation of Prepreg

After respectively mixing the resin compositions of the aforementioned examples and the comparative examples in a blender evenly, they are placed in an impregnation tank respectively. Then, a glass fiber fabric (2116 E-glass fiber fabric, available from Nan Ya Plastics Industry) is respectively immersed into the impregnation tank to allow the resin composition to adhere to the glass fiber fabric before undergoing a heat baking process to become semi-cured, thereby forming a prepreg.

Embodiment 7: Preparation of Copper-Clad Laminate

Four pieces of the prepregs respectively prepared above according to the aforementioned embodiments and two pieces of copper foils with a thickness of 18 μm are supplied. The copper foil, four pieces of the prepregs and copper foil are stacked in sequence before being laminated against each other under vacuum at 210° C. for two hours to form a copper-clad laminate, wherein, the stacked four pieces of prepregs are cured to form the insulating layer between the two copper foils.

Embodiment 8: Analysis of Properties

The resin compositions having the phosphaphenanthrene-based compounds in E1 to E12 and the resin compositions in C1 to C16 are selected in this test example. Each resin composition is evenly mixed in a blender before being put into an impregnation tank respectively. Then, a glass fiber fabric (2116 E-glass fiber fabric, available from Nan Ya Plastics Industry) is immersed into the impregnation tank to allow the resin composition to adhere to the glass fiber fabric before undergoing a heat baking process under 120° C.-160° C. to become semi-cured, thereby forming a prepreg.

Preparation of the Test Samples for Property Analysis:

1. Copper-Clad Laminate (Four Plies):

Two pieces of copper foils with a thickness of 18 μm, and four pieces of the prepregs manufactured according to the selected test sample are supplied, wherein each prepreg has a thickness of 0.127 mm. The content of the resin of each prepreg is about 55%. The copper foil, four pieces of the prepregs and copper foil are stacked in sequence before being laminated against each other under vacuum at 210° C. for two hours to form a copper-clad laminate. Wherein, the stacked four pieces of prepregs are cured to form the insulating layer between the two copper foils, and the content of the resin of the insulating layer is about 55%.

2. Copper-Free Laminate (Four Plies):

The aforementioned copper-clad laminate is etched to remove the two copper foils to obtain the copper-free laminate (four plies). Wherein the insulating layer of the copper-free laminate (four plies) is formed with four laminated prepregs, and the content of the resin of the copper-free laminate (four plies) is about 55%.

3. Copper-Free Laminate (Double Plies):

Two pieces of copper foils with a thickness of 18 μm and two pieces of the prepregs manufactured according to the selected test samples mentioned above are supplied, wherein each of the prepregs has a thickness of 0.127 mm. The content of the resin of each prepreg is about 55%. The copper foil, two pieces of the prepreg and copper foil are stacked in sequence before being laminated against each other under vacuum at 210° C. for two hours to form a double plies copper-clad laminate.

Next, the double plies copper-clad laminate undergoes etching to remove the two copper foils so as to obtain the copper-free laminate (double plies). Wherein the insulating layer is formed with two laminated prepregs, and the content of the resin of the copper-free laminate (double plies) is about 55%.

The property analysis of this test example includes the following items.

1. Glass Transition Temperature (Tg):

To measure the glass transition temperature, the copper-free laminate (four plies) is selected as the test sample. The glass transition temperature of each test sample is measured by a dynamic mechanical analysis (DMA) according to IPC-TM-650 2.4.24.4 test method.

2. Percent of Thermal Expansion (Dimension Change, CTE Z-Axis):

To measure the percent of thermal expansion, the copper-free laminate (four plies) is selected as the test sample. When heating the temperature from 50° C. to 260° C., the percent of thermal expansion of each test samples is measured by a thermal mechanical analyzer (TMA) according to IPC-TM-650 2.4.24.5 test method in this temperature range, wherein the unit is percentage (%). Lower the percent of dimension change is preferred, which means the resin composition has better properties when it is applied to the printed circuit board.

3. Solder Dipping (S/D):

To measure the solder dipping, the aforementioned copper-clad laminate (four plies) is selected as the test sample. According to IPC-TM-650 2.4.23 test method, each test sample is immersed in the solder pot with a constant temperature of 288° C. for 10 seconds each time, then, removed from the solder pot for 10 seconds in the room temperature, and then, immersed in the solder pot for 10 seconds again. Repeat the steps above to test the total cycle of thermal resistance without delamination of each test sample. The more total cycles of the test sample indicates that the thermal resistance of the copper-clad laminate made from the resin composition is better.

4. Thermal Resistance Test (T288):

In the T288, the aforementioned copper-clad laminate (four plies) is selected as the test sample. According to IPC-TM-650 2.4.24.1 test method, the duration of each test sample sustaining heat under a constant temperature of 288° C. without delamination is measured by thermal mechanical analyzer (TMA).

5. Dielectric Constant (Dk) and Dissipation Factor (Df):

To measure the dielectric constant and the dissipation factor, the aforementioned copper-free laminate (double plies) is selected as the test sample, measured at 10 GHz by a microwave dielectrometer (purchased from AET) according to JIS C2565 test method. The lower dielectric constant and lower dissipation factor indicates that the dielectric properties of the test sample are better.

6. Flame Retardancy:

In the flame retardancy test, the copper-free laminate (four plies) is selected as the test sample. The flame retardancy test is performed according to UL94 test method, and the analysis results are illustrated in the rankings V-0, V-1, and V-2, wherein the ranking V-0 is superior to V-1, V—1 is superior to V-2 and burnout is the worst.

7. Peel Strength (P/S)

To measure the peel strength, the aforementioned copper-clad laminate (four plies) is selected as the test sample. According to IPC-TM-650 2.4.8 test method, wherein the unit is lb/in.

The results of property analysis of the test samples prepared from the resin compositions of E1 to E12 and C1 to C16 are enumerated in Table 2, Table 4 and Table 6.

TABLE 1

The component examples (I) of the compositions

| Composition of resin | Component | | E1 | E2 | E3 | E4 | C1 | C2 | C3 | C4 | C5 | C6 | C7 |
|---|---|---|---|---|---|---|---|---|---|---|---|---|---|
| Flame retardant | Phosphorus-containing flame retardant with high melting point | Compound A | 25 | 25 | 25 | 25 | — | — | — | — | — | — | — |
| | Phosphorus-containing flame retardant with low melting point | SPB-100 | — | — | — | — | 25 | 60 | — | — | — | — | 25 |
| | Condensed phosphate ester | PX-200 | — | — | — | — | — | — | 25 | 70 | — | — | — |
| | Phosphorus-containing flame retardant with hydroxyl group | XZ92741 | — | — | — | — | — | — | — | — | 25 | 55 | — |
| Resin with an active unsaturated bond | Vinylbenzyl polyphenylene ether | OPE-2st | 100 | 100 | — | — | 100 | 100 | 100 | 100 | 100 | 100 | — |
| | Methacrylate polyphenylene ether | SA-9000 | — | — | 100 | 100 | — | — | — | — | — | — | 100 |
| | Maleimide | MIR-3000-70MT | — | 30 | — | 30 | — | — | — | — | — | — | — |
| Peroxide | Peroxide | 25B | 1 | 1 | 1 | 1 | 1 | 1 | 1 | 1 | 1 | 1 | 1 |
| Inorganic filler | Spherical silicon dioxide | SC-2050 SV | 70 | 70 | 70 | 70 | 70 | 70 | 70 | 70 | 70 | 70 | 70 |
| Solvent | Toluene | | 100 | 100 | 100 | 100 | 100 | 100 | 100 | 100 | 100 | 100 | 100 |
| | MEK | | 30 | 30 | 30 | 30 | 30 | 30 | 30 | 30 | 30 | 30 | 30 |

TABLE 2

The properties of laminate made from the component examples (I) of the compositions

| Property of laminate | Analysis item (method) | | E1 | E2 | E3 | E4 | C1 | C2 |
|---|---|---|---|---|---|---|---|---|
| Glass transition temperature | Tg (DMA) | ° C. | 201 | 220 | 209 | 220 | 190 | 155 |

TABLE 2-continued

| The properties of laminate made from the component examples (I) of the compositions | | | | | | | | |
|---|---|---|---|---|---|---|---|---|
| Percent of thermal expansion | Dimension change (TMA) | % | 2.15 | 2.12 | 2.36 | 2.31 | 3.04 | 3.35 |
| Thermal resistance at 288° C. | T288 (TMA) | Minute | >70 | >70 | 65 | 68 | 55 | 30 |
| Solder dipping | S/D | Cycle | >20 | >20 | >20 | >20 | >20 | 16 |
| Dielectric constant | Dk@10 GHz | Unit free | 3.50 | 3.58 | 3.57 | 3.71 | 3.68 | 3.74 |
| Dissipation factor | Df@10 GHz | Unit free | 0.0059 | 0.0062 | 0.0061 | 0.0068 | 0.0063 | 0.0075 |
| Flame retardancy | UL94 | Second | V-0 | V-0 | V-0 | V-0 | V-1 | V-0 |

| Property of laminate | Analysis item (method) | | C3 | C4 | C5 | C6 | C7 |
|---|---|---|---|---|---|---|---|
| Glass transition temperature | Tg (DMA) | ° C. | 166 | 140 | 184 | 172 | 194 |
| Percent of thermal expansion | Dimension change (TMA) | % | 3.24 | 3.86 | 2.72 | 3.23 | 3.03 |
| Thermal resistance at 288° C. | T288 (TMA) | Minute | 38 | 15 | 15 | 8 | 50 |
| Solder dipping | S/D | Cycle | 18 | 10 | 8 | 5 | >20 |
| Dielectric constant | Dk@10 GHz | Unit free | 3.74 | 3.87 | 3.70 | 3.95 | 3.68 |
| Dissipation factor | Df@10 GHz | Unit free | 0.0065 | 0.0079 | 0.0114 | 0.0129 | 0.0066 |
| Flame retardancy | UL94 | Second | V-2 | V-0 | V-1 | V-0 | V-1 |

TABLE 3

| The component examples (II) of the compositions | | | | | | | | | |
|---|---|---|---|---|---|---|---|---|---|
| Composition of resin | Component | | E5 | E6 | E7 | E8 | E9 | E10 | E11 |
| Flame retardant | Phosphorus-containing flame retardant with high melting point | compound A | 35 | 40 | 35 | 35 | 80 | 20 | 60 |
| | Phosphorus-containing flame retardant with low melting point | SPB-100 | — | — | — | — | — | — | — |
| | Condensed phosphate ester | PX-200 | — | — | — | — | — | — | — |
| | Phosphorus-containing flame retardant with hydroxyl group | XZ92741 | — | — | — | — | — | — | — |
| Resin with an active unsaturated bond | Vinylbenzyl polyphenylene ether | OPE-2st | 100 | 100 | 100 | 100 | 100 | 100 | 100 |
| | Polybutadiene-styrene copolymer | D-1118 | 5 | 5 | — | — | — | — | 5 |
| | Polybutadiene-styrene copolymer | Ricon100 | 50 | 60 | 20 | 20 | — | — | — |
| | Styrene-polybutadiene-maleic anhydride copolymer | Ricon184MA6 | 15 | — | — | — | — | — | 5 |
| | Maleimide | MIR-3000-70MT | — | — | 50 | 5 | — | — | 7 |

TABLE 3-continued

The component examples (II) of the compositions

| | | | | | | | | | |
|---|---|---|---|---|---|---|---|---|---|
| | Triallyl isocyanurate | TAC | — | — | — | — | — | — | — |
| | Divinylbenzene | DVB | — | — | — | — | — | — | — |
| Peroxide | Peroxide | 25B | 1 | 1 | 1 | 1 | 1 | 1 | 1 |
| Inorganic filler | Spherical silicon dioxide | SC-2050 SV | 70 | 70 | 70 | 70 | 70 | 70 | 70 |
| Solvent | Toluene | | 100 | 100 | 100 | 100 | 100 | 100 | 100 |
| | MEK | | 30 | 30 | 30 | 30 | 30 | 30 | 30 |

| Composition of resin | Component | | E12 | C8 | C9 | C10 | C11 | C12 | C13 |
|---|---|---|---|---|---|---|---|---|---|
| Flame retardant | Phosphorus-containing flame retardant with high melting point | compound A | 60 | 18 | 90 | 10 | — | — | — |
| | Phosphorus-containing flame retardant with low melting point | SPB-100 | — | — | — | — | 60 | — | — |
| | Condensed phosphate ester | PX-200 | — | — | — | — | — | 60 | — |
| | Phosphorus-containing flame retardant with hydroxyl group | XZ92741 | — | — | — | — | — | — | 60 |
| Resin with an active unsaturated bond | Vinylbenzyl polyphenylene ether | OPE-2st | 100 | 100 | 100 | 100 | 100 | 100 | 100 |
| | Polybutadiene-styrene copolymer | D-1118 | 5 | — | 5 | — | 5 | 5 | 5 |
| | Polybutadiene-styrene copolymer | Ricon100 | 15 | — | — | — | — | — | — |
| | Styrene-polybutadiene-maleic anhydride copolymer | Ricon184MA6 | 5 | — | 5 | — | 5 | 5 | 5 |
| | Maleimide | MIR-3000-70MT | 7 | — | 7 | — | 7 | 7 | 7 |
| | Triallyl isocyanurate | TAC | 10 | — | — | — | — | — | — |
| | Divinylbenzene | DVB | 10 | — | — | — | — | — | — |
| Peroxide | Peroxide | 25B | 1 | 1 | 1 | 1 | 1 | 1 | 1 |
| Inorganic filler | Spherical silicon dioxide | SC-2050 SV | 70 | 70 | 70 | 70 | 70 | 70 | 70 |
| Solvent | Toluene | | 100 | 100 | 100 | 100 | 100 | 100 | 100 |
| | MEK | | 30 | 30 | 30 | 30 | 30 | 30 | 30 |

TABLE 4

The properties of laminate made from the component examples (II) of the compositions

| Property of laminate | Analysis item (method) | | E5 | E6 | E7 | E8 | E9 | E10 | E11 |
|---|---|---|---|---|---|---|---|---|---|
| Glass transition temperature | Tg (DMA) | °C. | 198 | 194 | 234 | 210 | 184 | 200 | 210 |
| Percent of thermal expansion | Dimension change (TMA) | % | 2.41 | 2.75 | 2.05 | 2.21 | 2.65 | 2.14 | 1.93 |
| Thermal resistance at 288° C. | T288 (TMA) | Minute | >70 | >70 | >70 | >70 | >70 | >70 | >70 |
| Solder dipping | S/D | Cycle | >20 | >20 | >20 | >20 | >20 | >20 | >20 |
| Dielectric constant | Dk@10 GHz | Unit free | 3.41 | 3.43 | 3.60 | 3.50 | 3.70 | 3.50 | 3.50 |
| Dissipation factor | Df@10 GHz | Unit free | 0.0052 | 0.0047 | 0.0058 | 0.0056 | 0.0060 | 0.0053 | 0.0052 |

TABLE 4-continued

The properties of laminate made from the component examples (II) of the compositions

| Flame retardancy | UL94 | Second | V-0 | V-0 | V-0 | V-0 | V-0 | V-0 | V-0 |
|---|---|---|---|---|---|---|---|---|---|
| Property of laminate | Analysis item (method) | | E12 | C8 | C9 | C10 | C11 | C12 | C13 |
| Glass transition temperature | Tg (DMA) | °C. | 208 | 199 | 179 | 190 | 185 | 180 | 190 |
| Percent of thermal expansion | Dimension change (TMA) | % | 1.98 | 2.14 | 2.73 | 3.0 | 3.54 | 3.49 | 2.71 |
| Thermal resistance at 288° C. | T288 (TMA) | Minute | >70 | >70 | 59 | 64 | 64 | 30 | 3 |
| Solder dipping | S/D | Cycle | >20 | >20 | >20 | >20 | >20 | >20 | 12 |
| Dielectric constant | Dk@10 GHz | Unit free | 3.50 | 3.50 | 3.80 | 3.60 | 3.70 | 3.70 | 4.10 |
| Dissipation factor | Df@10 GHz | Unit free | 0.0051 | 0.0053 | 0.0062 | 0.0056 | 0.0063 | 0.0063 | 0.0123 |
| Flame retardancy | UL94 | Second | V-0 | V-1 | V-0 | burn out | V-2 | burn out | V-1 |

25

TABLE 5

The component examples (III) of the compositions

| Composition of resin | Component | | E1 | C14 | C15 | C16 |
|---|---|---|---|---|---|---|
| Flame retardant | Phosphorus-containing flame retardant with high melting point | Compound A | 25 | — | — | — |
| | Phosphorus-containing flame retardant (formula (IV)) | Compound B | — | 25 | 28 | — |
| | Phosphorus-containing flame retardant (formula (V)) | Compound C | — | — | — | 25 |
| Resin with an active unsaturated bond | Vinylbenzyl polyphenylene ether | OPE-2st | 100 | 100 | 100 | 100 |
| Peroxide | Peroxide | 25B | 1 | 1 | 1 | 1 |
| Inorganic filler | Spherical silicon dioxide | SC-2050 SV | 70 | 70 | 70 | 70 |
| Solvent | Toluene | | 100 | 100 | 100 | 100 |
| | MEK | | 30 | 30 | 30 | 30 |

TABLE 6

The properties of laminate made from the component examples (III) of the compositions

| Property of laminate | Analysis item (method) | | E1 | C14 | C15 | C16 |
|---|---|---|---|---|---|---|
| Peel strength between the laminate and the copper foil | P/S (Hoz) | lb/in | 4.3 | 3.5 | 3.25 | 3.13 |
| Percent of thermal expansion | Dimension change (TMA) | % | 2.05 | 2.56 | 2.9 | 2.51 |
| Thermal resistance at 288° C. | T288 (TMA) | Minute | >70 | >70 | >70 | 65 |

TABLE 6-continued

The properties of laminate made from the component examples (III) of the compositions

| Property of laminate | Analysis item (method) | | E1 | C14 | C15 | C16 |
|---|---|---|---|---|---|---|
| Solder dipping | S/D | Cycle | >20 | >20 | >20 | >20 |
| Flame retardancy | UL94 | Second | V-0 | V-1 | V-0 | V-0 |

Further researching the properties of the product (the laminate for example), the result demonstrates the importance of the selection of the phosphorus-containing compound and the resin.

From the Table 1 and Table 2, to compare the composition comprises the resin with an active unsaturated bond with the compound A as the phosphorus-containing compound and the composition comprises the phosphorus-containing flame retardant SPB-100, PX-200 and XZ92741 individually (the comparisons of the compositions E1 to E4 and the compositions C1 to C7 which are shown in Table 1), the glass transition temperature of the product made from the composition comprising the compound A and the resin with an active unsaturated bond is higher than the other three evidently. In addition, the percent of thermal expansion of the product made from the composition comprising the compound A and the resin with an active unsaturated bond is lower than the other three evidently, and the dielectric constant and the dissipation factor of the product made from the composition comprising the compound A and the resin with an active unsaturated bond are lower than the other three evidently.

The desired effect of the present invention can be obtained provided that the resin in collocation with the compound A, the phosphorus-containing flame retardant, comprises an unsaturated bond. In the resin, selecting the vinylbenzyl polyphenylene ether or the methacrylate polyphenylene ether is more profitable, and the outstanding effect is shown in the aforementioned tables.

The preferred embodiment is the resin further comprises maleimide (the composition E2 and E4 shown in Table 1), such that the glass transition temperature, the low dielectric property, the thermal resistance and the percent of thermal expansion are all well improved, and more particularly, the improvement of the glass transition temperature is the most evident.

The most preferred embodiment having the best overall properties is that the composition comprises the compound A as the flame retardant, and the resin with an active unsaturated bond comprises the vinylbenzyl polyphenylene ether, the polybutadiene-styrene copolymer, the styrene-polybutadiene-maleic anhydride copolymer and maleimide at the same time (the compositions E11 and E12 shown in Table 3).

Unanticipatedly, as shown in Table 5 to Table 6, comparing the composition E1 (the collocation of the compound A and the vinylbenzyl polyphenylene ether) with other compositions (C14 to C16, the collocation of the compound B or the compound C and the vinylbenzyl polyphenylene ether), the laminate made from the composition E1 not only features a great dielectric property, a great flame retardancy and a great thermal resistance but also improves a peel strength between the laminate and the copper foil.

The aforementioned embodiments are the adoptable applications of the present invention. However, the applications of the present invention are not limited by the aforementioned embodiments. The alterations, modifications, substitutions, combinations and simplification without departing from the spirit and principles of the present invention are all equivalent replacement of the present invention and are contained in the claimed scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low-dielectric resin composition, comprising:
   (a) 18 to 80 parts by weight of a phosphorus-containing flame retardant, being expressed by formula (I) below:

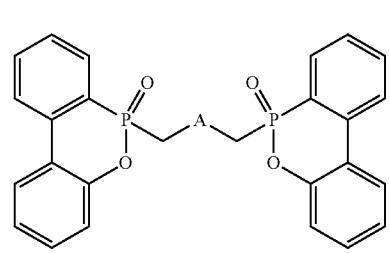

Formula (I)

wherein A is a phenylene or a biphenylene; and
   (b) 100 parts by weight of a vinyl polyphenylene ether resin, wherein a laminate made from the low-dielectric resin composition has a percent of thermal expansion as measured by reference to IPC-TM-650 2.4.24.5 of less than or equal to 2.75%, a T288 thermal resistance as measured by reference to IPC-TM-650 2.4.24.1 of greater than or equal to 65 minutes and a peel strength as measured by reference to IPC-TM-650 2.4.8 of greater than or equal to 4.00 lb/in.

2. The low-dielectric resin composition according to claim 1, wherein the phosphorus-containing flame retardant is expressed by formula (Ia) or formula (Ib):

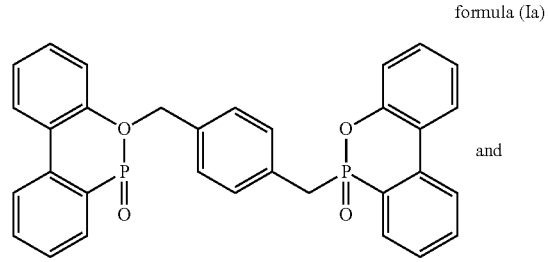

formula (Ia)

and

-continued formula (Ib)

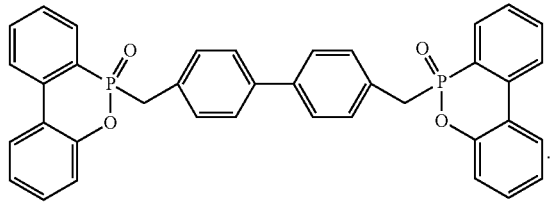

3. The low-dielectric resin composition according to claim 1, wherein the vinyl polyphenylene ether resin is a polyphenylene ether resin with a capping group having an unsaturated double bond.

4. The low-dielectric resin composition according to claim 1, wherein the vinyl polyphenylene ether resin is selected from the following: vinylbenzyl-terminated polyphenylene ether resin, methacrylate-terminated polyphenylene ether resin and a combination thereof.

5. The low-dielectric resin composition according to claim 4, wherein the vinylbenzyl-terminated polyphenylene ether resin and the methacrylate-terminated polyphenylene ether resin are expressed by formula (II) and formula (III) below respectively:

formula (II)

formula (III)

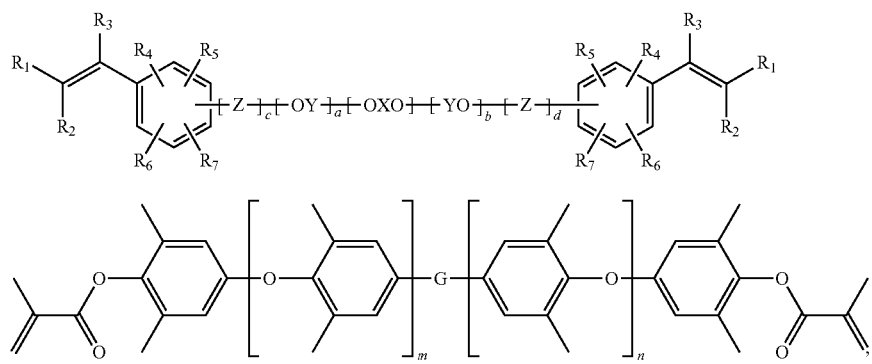

wherein —(O—X—O)— is

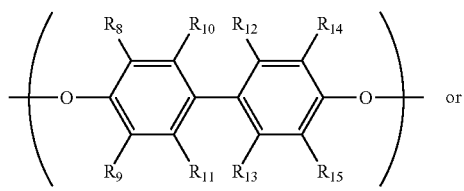

or

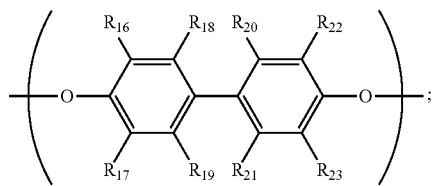

—(Y—O)— is

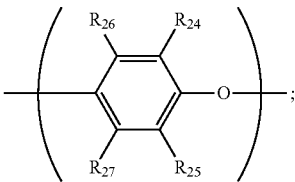

wherein $R_1$ and $R_2$ are a hydrogen atom, and $R_3$, $R_4$, $R_5$, $R_6$ and $R_7$ are the same as or different from each other, each independently representing a hydrogen atom or an alkyl group;

$R_8$, $R_9$, $R_{10}$, $R_{13}$, $R_{14}$ and $R_{15}$ are the same as or different from each other, each independently representing a $C_1$ to $C_6$ alkyl group or a phenyl group, and $R_{11}$ and $R_{12}$ are the same as or different from each other, each independently representing a hydrogen atom, a $C_1$ to $C_6$ alkyl group or a phenyl group;

$R_{16}$, $R_{17}$, $R_{22}$ and $R_{23}$ are the same as or different from each other, each independently representing a $C_1$ to $C_6$ alkyl group or a phenyl group, and $R_{18}$, $R_{19}$, $R_{20}$ and $R_{21}$ are the same as or different from each other, each independently representing a $C_1$ to $C_6$ alkyl group or a phenyl group;

A is a $C_1$ to $C_{20}$ linear hydrocarbon, a $C_1$ to $C_{20}$ branched hydrocarbon or a $C_1$ to $C_{20}$ cyclic hydrocarbon;

$R_{24}$ and $R_{25}$ are the same as or different from each other, each independently representing a $C_1$ to $C^6$ alkyl group or a phenyl group, and $R_{26}$ and $R_{27}$ are the same as or different from each other, each independently representing a hydrogen atom, a $C_1$ to $C_6$ alkyl group or a phenyl group;

Z is an organic group having at least one carbon atom;

a and b are a natural number ranges from 1 to 30 respectively;

c and d are 1;

G is a —C(CH$_3$)$_2$—, —CH$_2$— or a covalent bond; and m and n are a natural number ranges from 1 to 15 respectively.

6. The low-dielectric resin composition according to claim 5, wherein A is a $C_1$ to $C_6$ linear hydrocarbon, a $C_1$ to $C_6$ branched hydrocarbon or a $C_1$ to $C_6$ cyclic hydrocarbon.

7. The low-dielectric resin composition according to claim 5, wherein A is —CH$_2$— or —C(CH$_3$)$_2$—.

8. The low-dielectric resin composition according to claim 5, wherein Z is a $C_1$ to $C_6$ alkyl group.

9. The low-dielectric resin composition according to claim 5, wherein Z is an organic group having at least one carbon atom, and the organic group further comprises an oxygen atom or a nitrogen atom.

10. The low-dielectric resin composition according to claim 5, wherein Z is a methylene (—CH$_2$—).

11. The low-dielectric resin composition according to claim 5, wherein a and b are the same as or different from each other, and a and b are a natural number ranges from 1 to 10 respectively.

12. The low-dielectric resin composition according to claim 1, wherein when an amount of the vinyl polyphenylene ether resin of the low-dielectric resin composition is 100 parts by weight, an amount of the phosphorus-containing flame retardant ranges from 20 to 80 parts by weight.

13. The low-dielectric resin composition according to claim 1, wherein the low-dielectric resin composition further comprises a polyolefin in an amount ranges from 10 to 70 parts by weight and maleimide in an amount of 5 to 50 parts by weight.

14. The low-dielectric resin composition according to claim 1, wherein the low-dielectric resin composition further comprises: epoxy resin, phenol resin, benzoxazine resin, styrene-maleic anhydride resin, polyester, an amine curing agent, polyamide, polyimide, a curing accelerator, a solvent, a silane coupling agent, and an inorganic filler or a combination thereof.

15. The low-dielectric resin composition according to claim 14, wherein the phenol resin is selected from the following: hydroxy polyphenylene ether resin, phenoxy resin, and phenolic resin and a combination thereof.

16. A prepreg made from the low-dielectric resin composition according to claim 1.

17. A resin film made from the low-dielectric resin composition according to claim 1.

18. A resin coated copper, made from the low-dielectric resin composition according to claim 1.

19. A laminate, made from a prepreg, a rein film, or a resin coated copper which is made from the low-dielectric resin composition according to claim 1.

20. A printed circuit board, made from the laminate according to claim 19.

21. The low-dielectric resin composition according to claim 1, wherein the low-dielectric resin composition further comprises a monomer comprising an unsaturated reactive functional group, and the monomer comprising the unsaturated reactive functional group is styrene, divinylbenzene, trivinylcyclohexane or a combination thereof.

22. The low-dielectric resin composition according to claim 1, wherein the low-dielectric resin composition further comprises: polyolefin, cyanate ester resin, maleimide, triallyl isocyanurate, triallyl cyanurate and a combination thereof.

23. A low-dielectric resin composition, comprising:
(a) 18 to 80 parts by weight of a phosphorus-containing flame retardant, being expressed by formula (I) below:

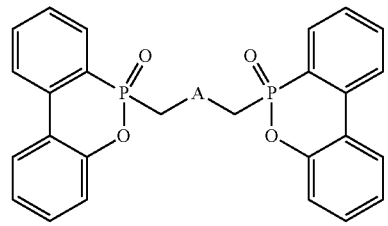

Formula (I)

wherein A is a phenylene or a biphenylene; and
(b) 100 parts by weight of a vinyl polyphenylene ether resin, wherein a laminate made from the low-dielectric resin composition has a percent of thermal expansion as measured by reference to IPC-TM-650 2.4.24.5 of less than or equal to 3.00%, a T288 thermal resistance as measured by reference to IPC-TM-650 2.4.24.1 of greater than or equal to 65 minutes, a flame retardancy as measured in accordance with the UL94 rating to evaluate flame retardancy level represented by V-1 or V-0 and a peel strength as measured by reference to IPC-TM-650 2.4.8 of greater than or equal to 4.00 lb/in.

* * * * *